(12) United States Patent
Pond, Jr. et al.

(10) Patent No.: US 7,006,951 B2
(45) Date of Patent: *Feb. 28, 2006

(54) METHOD FOR SOLVING FINITE ELEMENT MODELS USING TIME SLABBING

(75) Inventors: Stuart W. Pond, Jr., Cincinatti, OH (US); Edward J. Barragy, Austin, TX (US)

(73) Assignee: Object Reservoir, Inc., Austin, TX (US)

( * ) Notice: Subject to any disclaimer, the term of this patent is extended or adjusted under 35 U.S.C. 154(b) by 846 days.

This patent is subject to a terminal disclaimer.

(21) Appl. No.: 09/895,820

(22) Filed: Jun. 29, 2001

(65) Prior Publication Data

US 2002/0035453 A1 Mar. 21, 2002

Related U.S. Application Data

(60) Provisional application No. 60/215,697, filed on Jun. 29, 2000.

(51) Int. Cl.
*G06F 17/10* (2006.01)

(52) U.S. Cl. .................. 703/2; 345/419; 345/420; 703/6; 703/10; 703/23

(58) Field of Classification Search ............... 703/2, 703/6, 10, 23; 345/419, 420
See application file for complete search history.

(56) References Cited

U.S. PATENT DOCUMENTS

| | | |
|---|---|---|
| 3,029,018 A | 4/1962 | Floyd, Jr. |
| 3,302,710 A | 2/1967 | Odeh |
| 4,742,473 A | 5/1988 | Shugar et al. |
| 4,821,164 A | 4/1989 | Swanson |
| 5,255,212 A | 10/1993 | Kondoh et al. ............. 364/578 |
| 5,432,718 A | 7/1995 | Molvig et al. |
| 5,553,009 A * | 9/1996 | Meshkat et al. .............. 716/20 |
| 5,572,634 A | 11/1996 | Duluk, Jr. |
| 5,604,911 A | 2/1997 | Ushiro |
| 5,617,322 A | 4/1997 | Yokota |

(Continued)

FOREIGN PATENT DOCUMENTS

EP 0 709 789 5/1996

(Continued)

OTHER PUBLICATIONS

Zwart et al., "Space-Time Meshing for Two-Dimensional Moving Boundary Problems", Proceedings of Seventh International Meshing Roundtable, 1998, pp. 187-199.*

(Continued)

*Primary Examiner*—Jean R. Homere
*Assistant Examiner*—Herng-der Day
(74) *Attorney, Agent, or Firm*—Toler, Larson & Abel, LLP (57) ABSTRACT

A method for solving finite element problems in n+1 dimensions by iteratively extruding an n-dimensional finite element mesh in an n+1th dimension to form "slabs" which can be more easily solved within the entire n+1-dimensional problem. In a preferred embodiment, a three-dimensional unstructured finite element mesh representing a physical system is extruded in the time dimension. The four-dimensional prisms formed by the extrusion are divided into simplices, forming the four-dimensional finite element mesh of an individual time slab. Time slabs corresponding to a series of time intervals are sequentially generated and solved. In a preferred embodiment, only a few time slabs are stored in working memory at a time so that a reduced amount of memory (in comparison to conventional methods of solving comparable problems) is required.

24 Claims, 7 Drawing Sheets

U.S. PATENT DOCUMENTS

| | | | |
|---|---|---|---|
| 5,675,521 A | 10/1997 | Holzhauer et al. | |
| 5,699,271 A | 12/1997 | Sagawa et al. | |
| 5,710,726 A | 1/1998 | Rowney et al. | |
| 5,740,342 A | 4/1998 | Kocberber | |
| 5,754,181 A | 5/1998 | Amdursky et al. | |
| 5,891,131 A | 4/1999 | Rajan et al. | |
| 5,966,524 A | 10/1999 | Burnett et al. | |
| 5,999,187 A * | 12/1999 | Dehmlow et al. | 345/420 |
| 6,014,473 A | 1/2000 | Hossack et al. | |
| 6,018,497 A | 1/2000 | Gunasekera | |
| 6,028,607 A | 2/2000 | Chan | |
| 6,041,017 A | 3/2000 | Goldsberry | |
| 6,052,520 A | 4/2000 | Watts, III | |
| 6,054,992 A | 4/2000 | Gibson | |
| 6,064,810 A | 5/2000 | Raad et al. | 395/500.43 |
| 6,070,125 A | 5/2000 | Murphy et al. | |
| 6,078,869 A | 6/2000 | Gunasekera | |
| 6,106,561 A | 8/2000 | Farmer | |
| 6,191,796 B1 | 2/2001 | Tarr | |
| 6,230,101 B1 | 5/2001 | Wallis | |
| 6,313,837 B1 | 11/2001 | Assa et al. | |
| 6,366,279 B1 | 4/2002 | Gorman | |
| 6,445,390 B1 | 9/2002 | Aftosmis et al. | |
| 6,448,788 B1 | 9/2002 | Meaney et al. | |
| 6,516,080 B1 | 2/2003 | Nur | |
| 6,552,724 B1 | 4/2003 | Marshall | |
| 6,587,104 B1 | 7/2003 | Hoppe | |
| 6,608,628 B1 | 8/2003 | Ross et al. | |
| 6,633,837 B1 | 10/2003 | Dye et al. | |
| 6,674,432 B1 | 1/2004 | Kennon et al. | |
| 6,695,765 B1 | 2/2004 | Beebe et al. | |
| 6,816,820 B1 * | 11/2004 | Friedl et al. | 703/2 |
| 2002/0032494 A1 | 3/2002 | Kennon et al. | |
| 2002/0032550 A1 | 3/2002 | Ward et al. | |
| 2002/0035453 A1 | 3/2002 | Pond, Jr. et al. | |
| 2002/0046014 A1 | 4/2002 | Kennon | |
| 2002/0067373 A1 | 6/2002 | Roe et al. | |
| 2002/0072883 A1 | 6/2002 | Lim et al. | |
| 2002/0082813 A1 | 6/2002 | Lim et al. | |
| 2005/0015231 A1 | 1/2005 | Edwards et al. | |

FOREIGN PATENT DOCUMENTS

| | | |
|---|---|---|
| EP | 0 709 789 A2 | 5/1996 |
| EP | 0 801 364 B1 | 7/2003 |
| FR | 2775094 | 8/1999 |
| GB | 2326747 A | 12/1998 |
| WO | WO 99/40532 | 8/1999 |
| WO | WO 99/52048 | 10/1999 |
| WO | WO 99/57418 | 11/1999 |
| WO | WO 02/01251 A2 | 1/2002 |
| WO | WO 02/02901 A2 | 1/2002 |
| WO | WO 02/03101 A2 | 1/2002 |
| WO | WO 02/03103 A2 | 1/2002 |
| WO | WO 02/03262 A2 | 1/2002 |
| WO | WO 02/03263 A2 | 1/2002 |
| WO | WO 02/03264 A2 | 1/2002 |
| WO | WO 02/03265 A2 | 1/2002 |

OTHER PUBLICATIONS

Ho et al., "Generation and Rotation of 3-D Finite Element Mesh for Skewed Rotor Induction Motors Using Extrusion Technique", IEEE Transactions on Magnetics, May 1999, pp. 166-1269.*
International Search Report dated Mar. 5, 2002.
P.A. Forsyth, et al., "Local Mesh Refinement and Modeling of Faults and Pinchouts", SPE Form Evaluation, Jun. 1986, vol. 1, No. 3, pp. 275-285. XP-002191830.
Y. Ding, et al., "Development of Dynamic Local Grid Refinement in Reservoir Simulation", Proceedings of the 13th SPE Symposium on Reservoir Simulation, New Orleans, LA, Feb.-Mar. 1993, pp. 501-510. XP-002191831.
S. Verna, et al., "A Control Volume Scheme for Flexible Frids in Reservoir Simulation", Proceedings of the 1997 SPE Reservior Simulation Symposium, Dallas, TX, Jun. 1997, pp. 215-227. XP-002191832.
S. Kocberber, et al., "An Automatic, Unstructured Control Volume Generation System for Geologically Complex Reservoirs", Proceedings of the 1997 SPE Reservoir Simulation Symposium, Dallas, TX, Jun. 1997, pp. 241-252. XP-002191833.
Y. Kuwauchi, et al., "Development and Applications of a Three Dimentsional Voronoi-Based Fexible Grid Black Oil Reservoir Simulator", SPE Asia Specific Oil & Gas Congerence, Adelaide, Australia, Oct. 1996, pp. 1-12. XP-002191834.
R. Page, et al., "A Functional Program Describing a Simple Reservoir Model and Its Potential for Parallel Computation", Proceedings of the 1990 Symposium on Applied Computing, IEEE, Apr. 1990, pp. 85-91.
C. Giertsen, et al., "Volume Visulization of Sparse Irregular Meshes", Computer Graphics and Applications, IEEE, vol. 2, No. 2, Mar. 1992, pp. 40-48.
S. Ghosh, "Curvilinear Local Grid Refinement", SPE 50633, SPE European Petroleum Conference, The Netherlands, Oct. 20-22, 1998.
H. N. Sharpe, et al., "A New Adaptive Orthogonal Grid Generation Procedure for Reservoir Simulation" 65th Annual Technical Conference and Exhibition of the Society of Petroleum Engineers. New Orelans. LA. Sep. 23-26. 1990.
M. Wheeler, et al., "A Parallel Multiblock/Multidomain Approach for Reservoir Simulation", Proceedings of the 1999 15th Symposium on Reservoir Simulation, Houston, TX, Feb. 1999, XP-002188857.
D. Kahaner, et al., "An Expreimental Algorithm for N-Dimensional Adaptive Quadrature", ACM Transactions on Mathematical Software (TOMS), Mar. 1979, pp. 86-96.
Y. Ozdogan, "Seismic Data Processing", Society of Exploration Geophysics, Tulsa, OK, 1991, p. 514-515.
S. Norris, et al., "Modeling Fluid Flow Around Horizontal Wellbores", Proceedings: SPE Annual Technical Conference and Exhibition 1990 Part 4, New Orleans, LA Sep. 23-26, 1990, vol. SIGMA, pp. 65-75.
P. Perrochet, "Finite Hyperelements: A 4D Geometrical Framework Using Coariant Baes and Metric Tensors" Communications in Numberical Methods in Engineering, Jun. 1995, UK, vol. 11, No. 6, pp. 525-534.
J.M.M. Regtien, et al., "Interactive Reservoir Simulation", Proceedings of the 13th Symposium on Reservoir Simulation, San Antonio, TX Feb. 12-15, pp. 545-552.
C. Buckalew, et al., "Oilfield Visulization on the PC Platform", 2000 SPE/AAPG Western Regional Meeting, Jun. 19-23, 2000, pp. 1-5.
E. Farkas, Linearization Techniques of Reservoir Simulation Equations: Fully Implicit Cases, Proceedigns of the 1997 SPE Reservoir Simulation Symposium, Dallas, Texas Jun. 8-11, 1997, pp. 87-95.
E. Farkas, Linearization Techniques of Reservoir Simulation Equations: Fully Implicit Cases, Richardson, Texas, Dec. 1998, vol. 3, No. 4, pp. 316-323.
P. Benedeck, Capacitances of Planar Multiconductor Configuration on a Dielectric Substrate by a Mixed Order Finite-Element Method, IEEE1974.

Fu, et al., Time Integration Procedures for a Cyclic Thermoviscoplasticity Model for Pb-Sn solder applications, IEEE 1996.

P. J. Zwart, et al., "Space-Time Meshing for Two-Dimensional Moving Boundary Problems", Proceedings of the Seventh International Meshing Roundtable, pp. 187-199, 1998.

S. L. Ho, et al., "Generation and Rotation of 3-D Finite Element Mesh for Skewed Rotor Induction Motors Using Extrusion Technique", IEEE Transactions on Magnetics, pp. 1266-1269, May 1999.

Cuisiat, F., et al. "Petroleum Reservior Simulation Coupling Flow and Deformation," SPE 50636, pp. 63-72, 1998.

Economides, M., et al. "Petroleum Production Systems," Prentice-Hall PTR, ISBN 0-13-658683-X, pp. 57-70, 1994.

Forsyth, Peter. "A Control-Volume, Finite-Element Method for Local Mesh Refinement in Thermal Reservoir Simulation," SPE 18415, pp. 561-566, pp. 91-96, 1990.

Naji, H., et al. "A Fully Imlicit, Three-Dimensional, Two-Phase, Control-Volume Finite Element Model for the Simulation Naturally Fractured Reservoirs," SPE 36279, pp. 1-13, 1996.

Young, Larry C. "Rigorous Treatment of Distorted Grids in 3D," SPE 51899, pp. 1-14, 1999.

* cited by examiner

METHOD FOR SOLVING FINITE ELEMENT MODELS USING TIME SLABBING

RELATED APPLICATIONS

This application claims priority under 35 U.S.C. § 119(e) to U.S. Patent Application No. 60/215,697 entitled "Method and System for Oil Reservoir Simulation and Modeling" by Stephen R. Kennon, Kok Thye Lim, Scott A. Canaan, Steven B. Ward, Stuart W. Pond, Jr. and Edward J. Barragy, filed Jun. 29, 2000, which is incorporated by reference as if set forth in its entirety herein.

TECHNICAL FIELD OF THE INVENTION

This invention relates generally to methods for modeling physical systems using finite element analysis and, more specifically, to methods for creating finite element models used in simulating geological structures and corresponding fluid flow, especially in hydrocarbon reservoirs.

BACKGROUND OF THE INVENTION

Physical systems can be modeled mathematically to simulate their behavior under certain conditions. There are a wide variety of means to model these systems, ranging from the very simplistic to the extremely complicated. One of the more complicated means to model physical systems is through the use of finite element analysis. As the name implies, finite element analysis involves the representation of individual, finite elements of the physical system in a mathematical model and the solution of this model in the presence of a predetermined set of boundary conditions.

In finite element modeling, the region that is to be analyzed is broken up into sub-regions called elements. This process of dividing the region into sub-regions may be referred to as discretization or mesh generation. The region is represented by functions defined over each element. This generates a number of local functions that are much simpler than those which would be required to represent the entire region. The next step is to analyze the response for each element. This is accomplished by building a matrix that defines the properties of the various elements within the region and a vector that defines the forces acting on each element in the structure. Once all the element matrices and vectors have been created, they are combined into a structure matrix equation. This equation relates nodal responses for the entire structure to nodal forces. After applying boundary conditions, the structure matrix equation can be solved to obtain unknown nodal responses. Intra-element responses can be interpolated from nodal values using the functions which were defined over each element.

In prior art methods, when a solution to a structured three-dimensional model over time was desired, the model had be solved for a first time value, then again for a second time value, and so on, until a series of time steps covering the desired range was completed. If it was desired to model a temporal feature more accurately, the size of the time steps had to be decreased and the entire three-dimensional physical model had to be solved for a greater number of time values. The computing resources which were required to generate the solution obviously increased with the number of time steps for which the model was solved. There was no way to localize the smaller time steps to a particular physical volume of interest or to adapt the three-dimensional spatial model over time. Further, when an error occurred in the solution of the model for one of the time values, the model and/or the time steps had to be adjusted and the entire model solved again for each of the time values.

SUMMARY OF THE INVENTION

One or more of the problems outlined above may be solved by the various embodiments of the present invention. Broadly speaking, the invention comprises a method for solving space-time problems involving three-dimensional space by constructing a three-dimensional finite element model, then repeatedly extruding the model in a temporal dimension to form a "time slab" and solving the slab. This method may provide a number of advantages over prior art methods, including decreased memory usage, the ability to refine the spatial mesh from one time slab to another, the ability to adapt the temporal mesh to achieve convergence of a solution for the slab, the ability to perform "checkpointing" of solutions for successive time slabs, and so on.

In one embodiment, the method comprises providing a three-dimensional mesh which models the system to be solved and extruding the three-dimensional mesh in a series of time slabs which are sequentially solved. Each slab is visited, solved, adapted and re-solved if necessary to meet any error criteria, and then archived. Each slab includes a plurality of nodes that represent a region of four-dimensional space (i.e., space-time.) As each slab is solved, it may be desirable to refine the slab in the particular spatial regions of interest (for example, to obtain more accurate solutions in these regions.) Likewise, it may be desirable to refine the slab in the temporal dimension (for instance, to achieve convergence of the solution for the slab.) The solution for each slab may therefore be examined to determine whether refinement of the slab is necessary and, if so, the slab is adapted spatially (new nodes are added) and/or temporally (time steps are shortened.) After the slab has been appropriately refined, a new solution for the slab is generated. Because the solutions of the previous time slabs were completed and archived, there is no need to re-solve those slabs.

In one embodiment, all of the slabs to be solved are generated prior to the solution of any one of the slabs. In another embodiment, a first slab is generated and solved before a second slab is generated. The slab may be refined and re-solved as necessary to obtain a valid solution. After this solution is obtained, the slab is extruded to form a subsequent slab. (Although each slab is extruded from the spatial mesh which forms the boundary between the slabs, this may be more conveniently referred to as extruding one slab from the previous slab.) This subsequent slab is then solved, and the process is repeated until the desired time range has been covered. In another embodiment, the current time slab and at least one subsequent slab are generated. The current slab is then solved, including any refinements which are necessary. After the current slab has been solved, a new slab is extruded from the subsequent slab rather than the current slab. Because any particular slab is generated from the previous slab before the previous slab is refined (during the process of solving it,) refinements to each slab which do not need to be carried through from one slab to the next are not propagated through the slabs.

Numerous alternative embodiments are also possible. Particularly, it should be noted that the present methods, though described primarily with reference to the modeling of three-dimensional physical systems (e.g., oil reservoirs,) may be applicable in other contexts as well.

BRIEF DESCRIPTION OF THE DRAWINGS

Other objects and advantages of the invention may become apparent upon reading the following detailed description and upon reference to the accompanying drawings in which.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the spirit and scope of the present invention as defined by the appended claims.

DETAILED DESCRIPTION OF A PREFERRED EMBODIMENT

A preferred embodiment of the invention is described below. It should be noted that this and any other embodiments described below are exemplary and are intended to be illustrative of the invention rather than limiting.

The present method is particularly well-suited to solving space-time problems involving three-dimensional space. In the prior art, three-dimensional finite element models were solved for a particular point in time. Put another way, the models were three-dimensional instead of four-dimensional. If a solution for the three-dimensional model over time was required, the three-dimensional model was solved for a first time value, then for a second time value, then a third, and so on. Thus, the finite element model was not a four-dimensional model, but was instead a three-dimensional model which was stepped over a given range of time values. The series of three-dimensional solutions to the three-dimensional model could then be combined to construct a four-dimensional solution.

Figure 1:
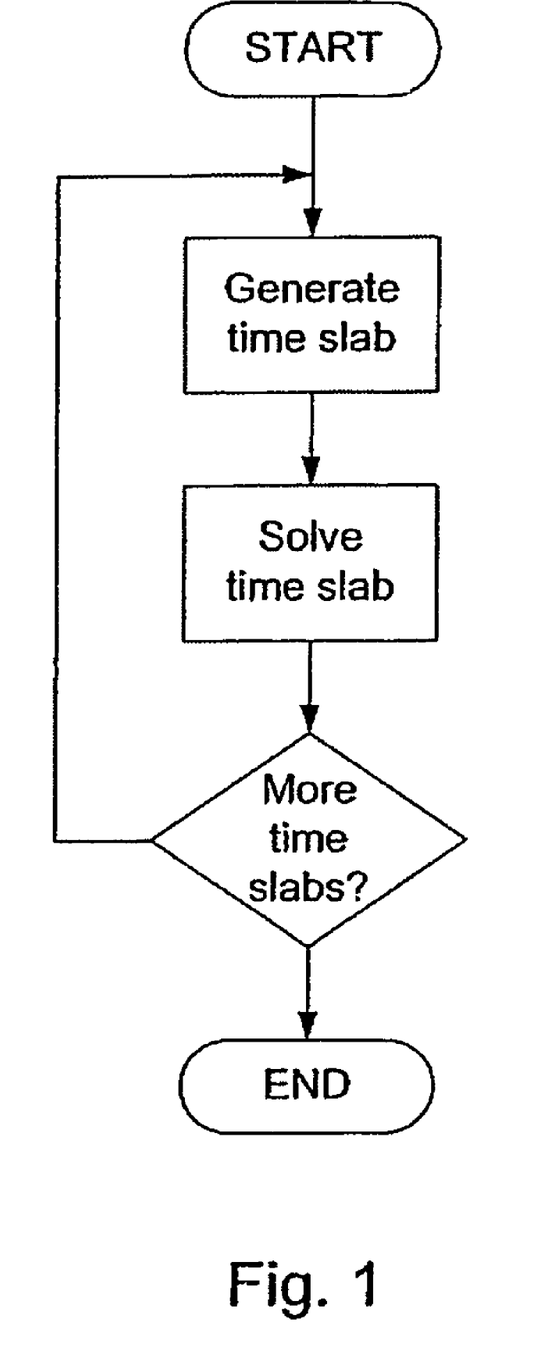
FIG. 1 is a flow diagram illustrating the basic steps of one embodiment of the present invention.

A preferred embodiment of the present method employs a series of four-dimensional finite element models to generate a four-dimensional solution. More particularly, an unstructured finite element mesh is generated in the form of a series of time slabs which model the desired physical system over a desired time span. Referring to FIG. 1, a flow diagram illustrating the basic steps of one embodiment of the present method is shown. As shown in the figure, the method comprises generating a plurality of time slabs and solving them. Each of the time slabs is sequentially visited and solved to generate a solution for that slab. This process is continued until all of the time slabs have been solved. The combined solutions for all of the slabs comprise a solution for the three-dimensional system over time. The unstructured four-dimensional finite element model is capable of following irregular spatial and temporal features of the modeled system, and the solution of the successive time slabs greatly reduces the memory required to generate a solution.

The details of a preferred embodiment will be set forth below. It may be helpful, however, to first define a few terms.

A node is a point in space. In finite element modeling, nodes form the vertices of the elements which are modeled. The nodes also form part of a mesh of nodes and edges which define the boundaries between elements in the modeled space.

An edge is a line between two nodes which form vertices of an element. The edges form part of the mesh which defines the boundaries between elements in the modeled space.

Figure 2:
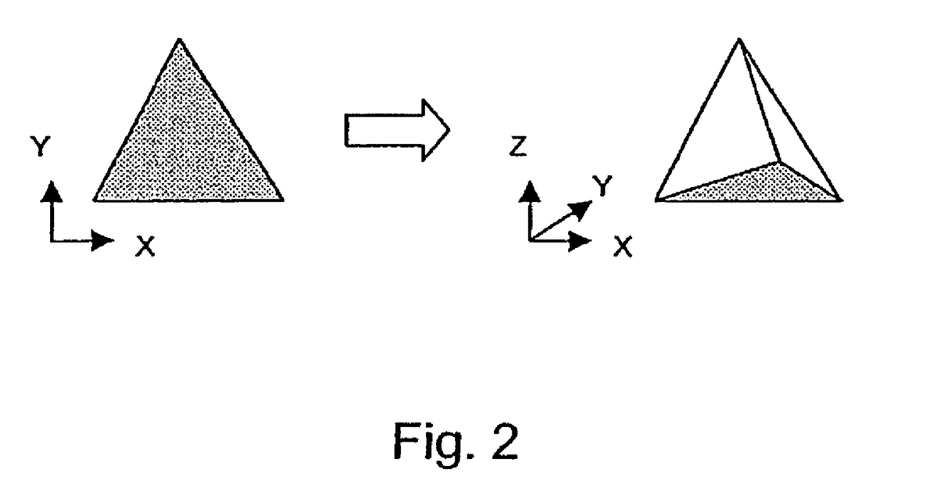
FIG. 2 is an illustration of the triangular and tetrahedral elements which comprise unstructured finite element meshes in one embodiment of the present invention.

A simplex is a spatial configuration of n dimensions determined by n+1 points in a space of dimension equal to or greater than n. In other words, a-simplex is a geometric spatial element having the minimum number of boundary points necessary to enclose a space in a given number of dimensions. For example, in two dimensions, a simplex comprises a triangle, together with the interior area bounded by the triangle (see FIG. 2.) Two points are insufficient to form a simplex in two-dimensional space because no area is bounded by the points (and the lines which interconnect them.) While four points may be sufficient to bound a two-dimensional area, they do not comprise the minimum number of boundary points by which the two-dimensional area can be bounded. In three dimensions, a simplex comprises a tetrahedron, which is bounded by four vertices (see FIG. 2.) In four dimensions, a simplex comprises a hyper-tetrahedron (sometimes referred to as a hypertet) having five vertices.

A mesh is a collection of elements that fill a space. These elements are representative of a system which resides in that space. Because each element can be defined by a plurality of nodes and/or the edges between those nodes, a mesh may alternatively be considered a collection of nodes and/or the edges between them. At various points in this disclosure, "mesh" will be used to alternately refer to collections of elements or nodes/edges, depending upon the context in which the term is used. The mesh may also be referred to herein as a finite element model or simply a model.

Figure 3:
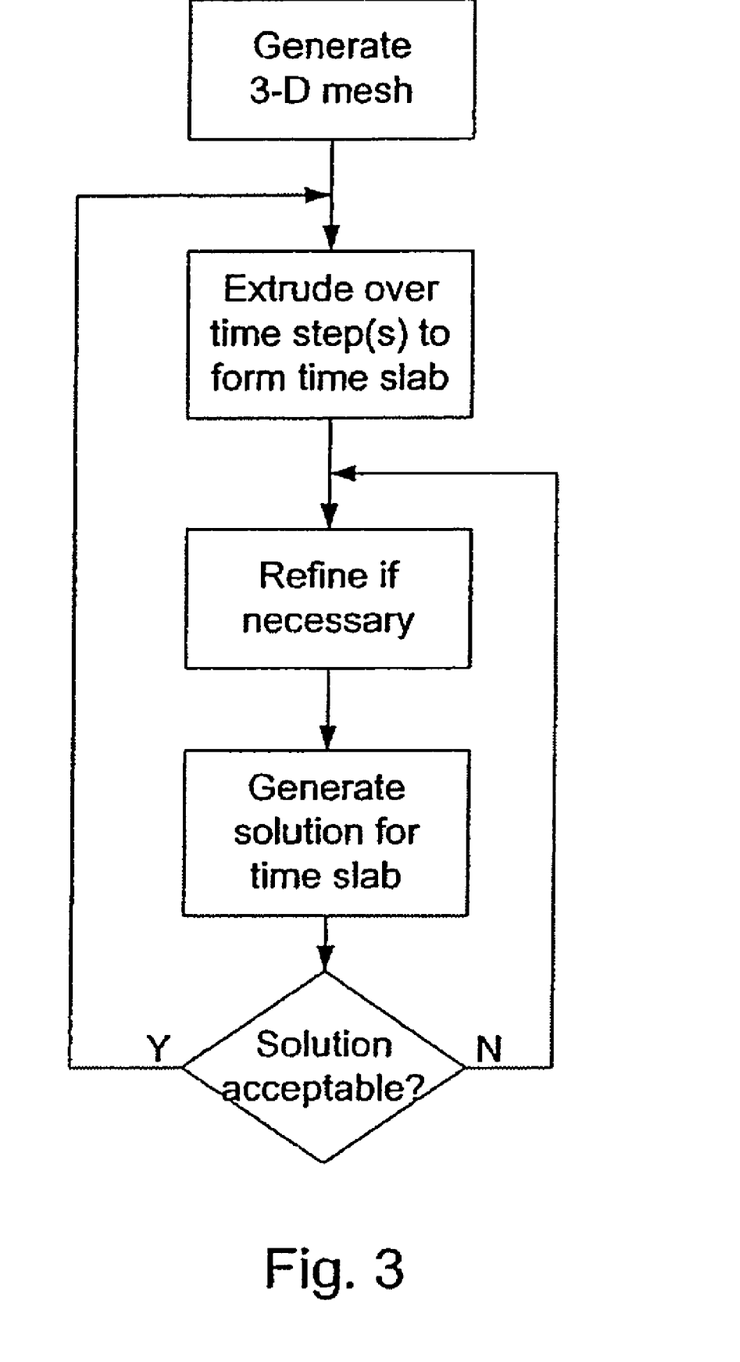
FIG. 3 is a flow diagram illustrating a method according to an alternative embodiment of the present invention.
Figure 4:
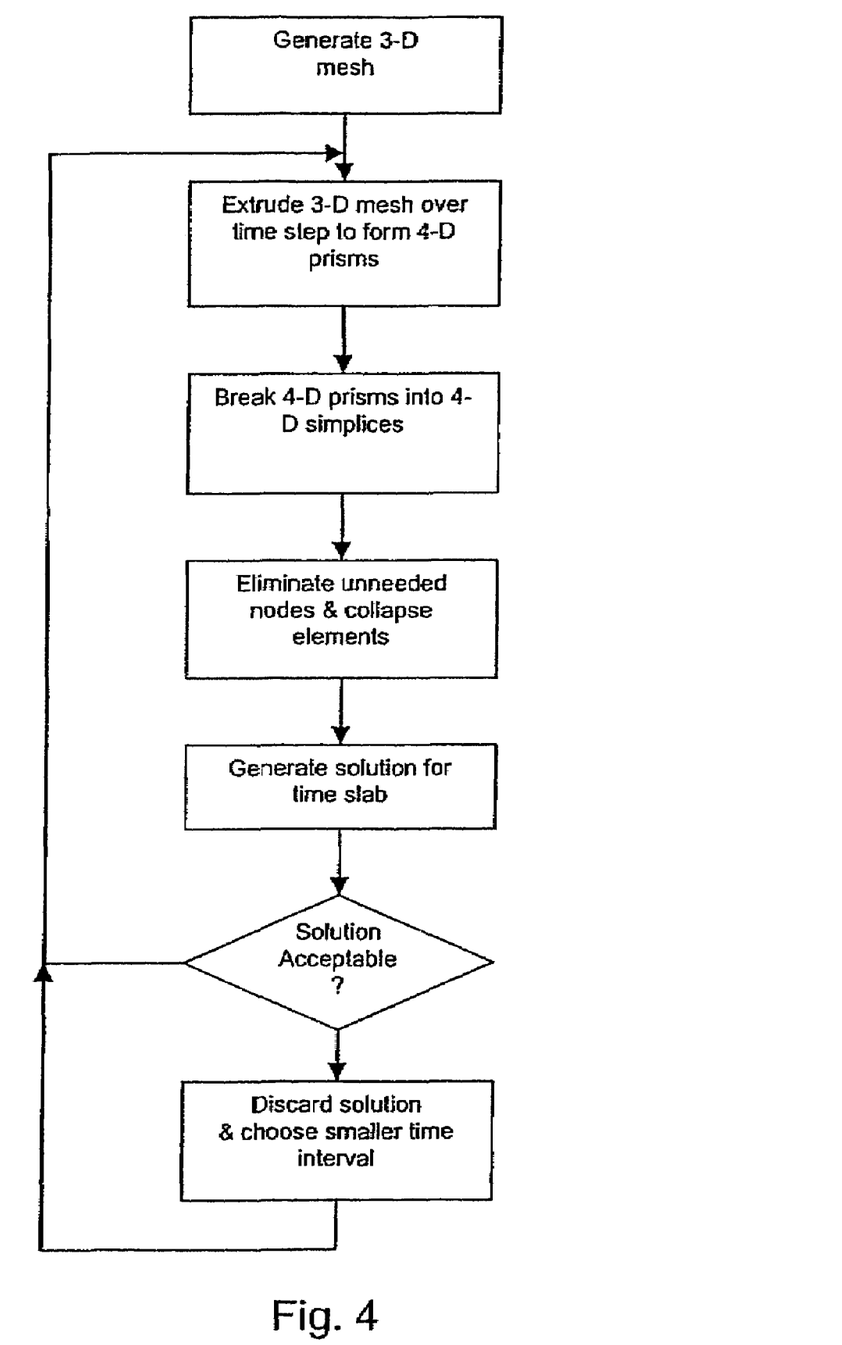
FIG. 4 is a flow diagram illustrating a method according to an alternative embodiment of the present invention.

Referring to FIG. 3, a flow diagram illustrating a method according to an alternative embodiment of the method is shown. The four-dimensional mesh of the time slabs in the preferred embodiment is generated from a three-dimensional mesh by extruding each of the simplices of the three-dimensional mesh in a fourth dimension (time.) The extrusion creates a four-dimensional prism from each of the three-dimensional simplices. These four-dimensional prisms are then divided into a plurality of four-dimensional simplices which form a four-dimensional finite element model. This process is shown graphically in FIG. 4. The extrusion can be repeated to form a slab that extends over a predetermined time range (although it should be noted that a slab can consist of a single extruded layer.) The elements of this model can be selectively refined to obtain a finer mesh in areas of greater interest, and a coarser mesh in areas which are of less interest. The mesh can be refined in the spatial dimensions (x, y, z) and, unlike time-stepped models, in the temporal dimension as well.

The time slabs are solved sequentially. In other words, a first one of the slabs is solved, then the next slab is solved, then the next, and so on. In one embodiment, after each of the time slabs is solved, it is archived. Because of the causal nature of time, the assumption can be made that no data relating to earlier time slabs will change once those slabs are solved. If a solution to a particular time slab does not converge, or if the solution does not meet the error criteria, the solution can be discarded, the mesh refined, and the time slab resolved. It is not necessary to re-solve any of the earlier time slabs because the refinement and resolving of the current slab does not affect the earlier slabs. (In conventional methods, the same three-dimensional mesh is time-stepped over the desired range, so if changes in the mesh are necessary at a later time step, they will have to be present at the earlier time steps as well. Thus, such changes necessitate that the entire solution be discarded.)

Figure 5:
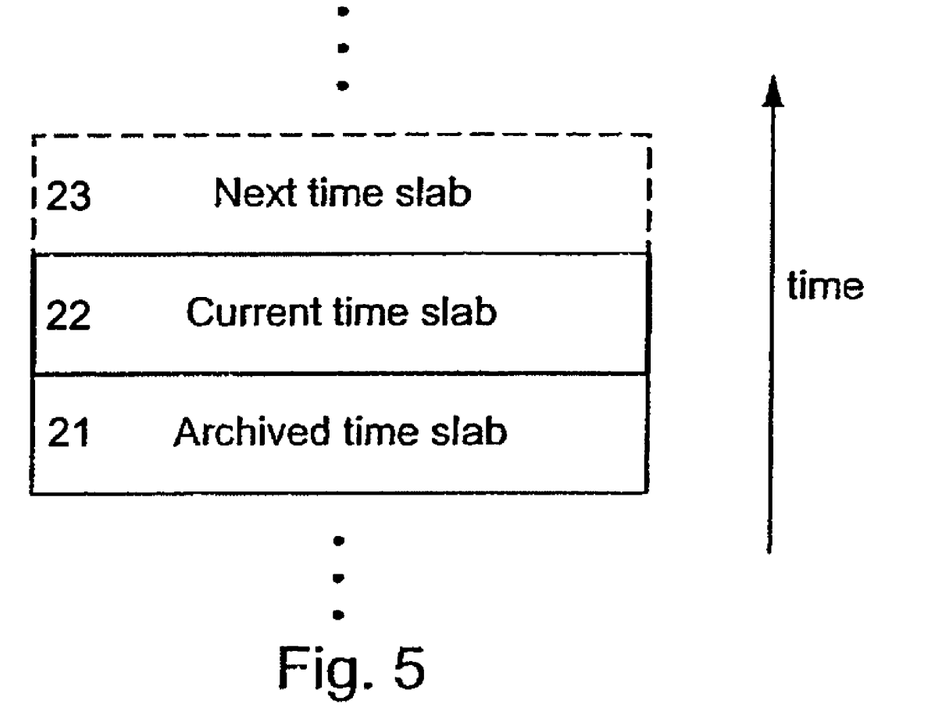
FIG. 5 is a diagram illustrating the relationship of the time slabs in one embodiment of the present invention.

Referring to FIG. 5, a diagram illustrating the relationship of the time slabs in one embodiment of the present method is shown. In this figure, the time slabs which correspond to earlier times are lower and the time slabs which correspond to later times are higher. It is assumed in this figure that each time slab is generated, then solved, then archived. (Other embodiments may maintain more time slabs in memory or may generate a subsequent time slab before solving the current one.) Three adjacent time slabs are depicted in FIG. 5. The earliest time slab 21 has been generated, solved and archived, so it is no longer in memory. Time slab 22 is the current slab. Time slab 22 has been generated and is being solved. This is the only time slab in memory in this embodiment. Time slab 23 has not yet been generated, and is therefore shown as a dashed outline. Time slab 23 will be generated after current time slab 22 has been solved and archived.

The present method has memory requirements which may be substantially less than conventional methods, depending upon the particular implementation. In one embodiment, all of the time slabs are stored in core memory while successive slabs are solved. This embodiment may provide only a minor improvement over the prior art in terms of memory usage. In another embodiment, only the slab for which a solution is currently being computed is retained in core memory—earlier slabs are archived since they are not needed for the current solution and will not be changed. In this case, the memory requirements are substantially reduced from the prior art. Still other embodiments may store more than one, but less than all of the time slabs in memory, thereby providing different magnitudes of reductions in memory usage.

In a preferred embodiment of the present method, the three-dimensional mesh representing the system to be modeled is preferably an unstructured mesh of three-dimensional simplices. (While some embodiments may be implemented using structured meshes, this disclosure will focus primarily on those embodiments which use unstructured meshes.) An unstructured mesh is preferred because the elements of unstructured meshes are not constrained by the same requirements as structured meshes (e.g., minimum size of elements) and are therefore capable of more closely matching nodes of the elements to points of interest (e.g., object surfaces or temporal disturbances.) As a result, unstructured meshes are typically capable of more accurately modeling physical systems than comparable structured meshes.

The three-dimensional mesh is extruded in the temporal dimension to form a time slab. The extrusion which forms the time slab extends generally from a first time to a second time, covering an interval which is a portion of the entire range of time over which a solution is desired. The time slabs may be said to generally correspond to a time interval because the nodes of the mesh may not correspond to only the "beginning" and "ending" times of the interval. The nodes are part of a four-dimensional mesh and may be adjusted temporally, as well as spatially, to more accurately reflect temporal and spatial features of the modeled system. Consequently, a particular time slab may not extend in a well-defined manner from a certain beginning time to a certain end time.

As indicated above, prior art methods do not actually solve a four-dimensional model. Instead, a three-dimensional model is solved at each of a plurality of time steps. Thus, if increased accuracy is desired in a particular time interval, the entire three-dimensional spatial model may be solved for an increased number of time values (using smaller time steps.) The structured mesh cannot be refined to have a first time step in a first spatial region and at the same time have a different time step in a second spatial region. Using the unstructured mesh of the present system and method, however, this is easily achieved.

Figure 6A:
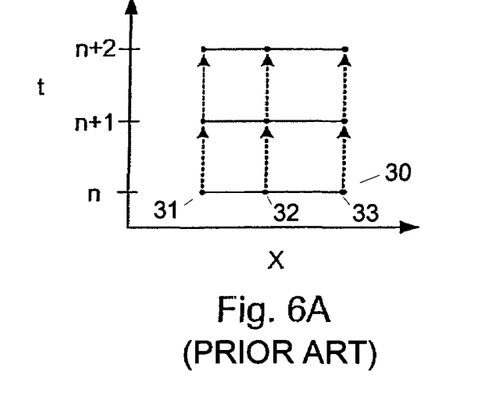
FIGS. 6A–6F are a series of diagrams showing the manner in which increased accuracy can be achieved in prior art methods and in one embodiment of the present invention.
Figure 6B:
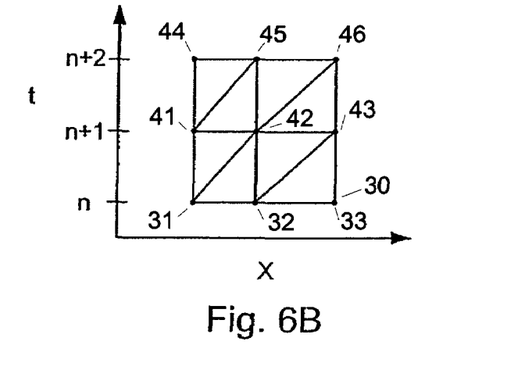

This is illustrated in FIGS. 6A–6F. FIGS. 6A–6B comprise a series of diagrams showing the manner in which increased accuracy can be achieved in prior art methods and in one embodiment of the present method. FIG. 6A depicts a one-dimensional mesh 30 comprising nodes 31–33. Mesh 30 is stepped through times n, n+1 and n+2 to generate a solution over time. In other words, a solution is generated at time n, then another solution is generated at time n+1, and finally a solution is generated at time n+2. In comparison, FIG. 6B depicts a one-dimensional mesh 30 which is extruded to form a two-dimensional mesh. This single mesh includes nodes 31–33 and 41–43. A second two-dimensional mesh is defined by nodes 41–46. Each of these two-dimensional meshes comprises a time slab extending from time n to time n+1, or from time n+1 to time n+2. (In an alternative embodiment, nodes 31–33 and 41–46 could define a single time slab extending from time n to time n+2.)

Figure 6C:
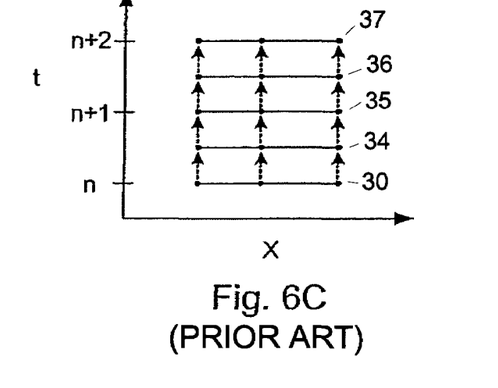

If a solution for the model varies rapidly with time, it may be desirable to modify the model to obtain a higher level of accuracy in the solution. In the case of the prior art method, this may be accomplished by reducing the time steps at which solutions for the one-dimensional model are computed, as illustrated in FIG. 6C. As shown in this figure, solutions for the one-dimensional mesh are calculated at times n (30), n+0.5, (34), n+1.0, (35), n≑1.5, (36) and n+2.0 (37). It can be seen from the figure that whenever time step is selected, this seine step is applied over the extent of the one-dimensional model 30—that time step is not varied from one part of the model to another. Consequently, if the rapid changes are confined to only a portion of the model, computational power may have to be wasted on computations involving unnecessary nodes. Using the present methods, the time slabs can be modified to add nodes only in the region of interest. Referring to FIG. 6, the one-dimensional model is extruded to form two time slabs as shown in FIG. 6B, but then two additional nodes, 51 and 52, are added in the region which exhibits the rapid change (at the center of each slab.) Thus, computations involving times n+0.5 and n+1.5 involve only a single node each. space) is generated. This three-dimensional mesh may be generated by any suitable means. This three-dimensional Similarly, if the solution for the model changes rapidly as a function of spatial position, but does so only at certain times, it may be possible to increase the accuracy of the solution for the model over time. As depicted in FIG. 6E, this can be accomplished in prior art methods by increasing the number of nodes in the one-dimensional mesh. In this figure, new nodes 38 and 39 have been added. This mesh is solved at each time step, whether the extra nodes are needed at that particular time or not. Using the present methods, however, the computational requirements can be decreased by extruding the original one-dimensional model to form the time slabs, then adding new nodes as necessary to increase accuracy in the time and region of interest. As shown in FIG. 6F, nodes 53 and 54 are added at time n+1. Consequently, the computational requirements associated with time n+1 are increased, but the computational requirements associated with times n and n+2 remain the same.

While the examples of FIGS. 6A–6F illustrate the case of a one-dimensional mesh which is solved over time, it should be noted that these examples can be extended to two, three, or even more dimensions (although the three-dimensional case is expected to be most prevalent.)

The usefulness of this capability can be illustrated using the following example. If a disturbance such as a pressure wave propagates through a reservoir, it may be desirable to improve the accuracy of the model by increasing the number of elements in the vicinity of the disturbance. Because the disturbance propagates through the reservoir as a function of time, the location at which the fine mesh is needed changes with time. In this instance, it is assumed that the disturbance will propagate through the entire space which is being modeled, so, at one time or another, each location in the modeled space will need to have an increased number of elements.

A structured three-dimensional mesh does not change with time. It is simply time-stepped, with each element in the mesh being advanced by the same interval (size of time step.) Thus, each region in the modeled space must have the maximum number of elements that will be desired at any time. A solution for the model at any given time requires solutions for all of these elements, regardless of whether the additional elements are needed at that particular time. As a result of the increased number of elements in the mesh, increased computing resources are required to generate a solution.

The present methods solve this problem by generating a space-time mesh that can be refined for particular regions of both space and time. While the n-dimensional mesh in the prior art is not altered from one time step to the next, the n+1-dimensional mesh used in the present method is generated slab-by-slab, with each slab being refined as needed to obtain the desired level of accuracy in particular areas. If this level of accuracy is not needed in later slabs, those slabs can be refined to consolidate elements in the mesh and thereby reduce the computational requirements of those slabs. Another advantage that may be provided by the present methods is that the nodes which define a particular slab need not all have the same time value. While prior art methods take all of the nodes of the mesh at a single point in time and calculate a solution, the present methods may calculate a solution for a set of nodes that have different time values. This may be useful, for example, to model a non-planar (e.g., spherical) wavefront passing through the modeled system.

It should be noted that the time slabs used in the present methods may comprise a single layer of elements, or multiple layers. A time slab which has a single layer may be generated by a single extrusion, resulting in each element having nodes on both sides of the slab. A time slab which has multiple layers may be generated by extruding an initial mesh in the temporal dimension, subdividing the resulting prisms into simplices, and repeating this process at least one more time to create additional layers of elements. In a multi-layer time slab, none of the elements will have nodes which lie on both faces of the slab, unless the slab is refined by collapsing together two or more elements which have nodes on both faces.

Generally speaking, the method comprises the successive generation and solution of N+1-dimensional finite element meshes, where each mesh extends generally over a corresponding interval of time (i.e., a time slab.) Because each time slab can be solved separately, the computational requirements for generation of a solution are simplified, and the memory requirements may be substantially reduced. The different embodiments may generate either structured or unstructured meshes (although an unstructured mesh is prefered) of two, three, four, or even more dimensions. The time slabs may be generated immediately prior to being solved, they may be generated one or two slabs ahead of the current slab (to limit the propagation of refinements,) or they may all be generated at once. The different embodiments may retain only the current time slab in memory, or they may retain several (e.g., the current slab and one or two succeeding slabs) or even all of the slabs in memory. Different embodiments may refine the time slabs to add nodes or collapse elements, or they may not refine the slabs at all.

As indicated above, the preferred embodiment generates four-dimensional time slabs from a three-dimensional finite element mesh. The initial three-dimensional mesh, as well as the four-dimensional time slabs comprise unstructured meshes. The generation of the four-dimensional mesh can be performed in a number of ways. A description of a preferred method follows. First, an unstructured three-dimensional mesh which is representative of the physical system to be modeled (i.e., a mesh X-Y-Z space) is generated. This three-dimensional mesh may be generated by any suitable means. This three-dimensional mesh is then extruded in the temporal dimension. (A preferred method of extrusion of the three-dimensional mesh will be described in more detail below.) The three-dimensional mesh is extruded over a certain interval which is equivalent to the minimum time step that would be desired at any region in the three-dimensional mesh during that interval. The extrusion creates a plurality of four-dimensional prisms, each of which is then broken up into three four-dimensional simplices, creating an unstructured four-dimensional mesh extending over the interval.

The extrusion and creation of simplices is then repeated for a succeeding interval. (It should be noted that each successive extrusion is made from the three-dimensional mesh displaced in the previous extrusion, and not from the four-dimensional simplices.) The four-dimensional mesh of the first interval is then examined to identify regions in which the mesh should be refined (i.e., nodes added and corresponding new simplices defined, or nodes eliminated and simplices collapsed.) In one instance, regions in which the minimum time step is not necessary may identified and elements in the region collapsed into fewer elements having larger time steps. This may result in an unstructured four-dimensional mesh which has varying time steps in different regions of the modeled four-dimensional space. (In an alternative embodiment, it is possible to generate a mesh that uses larger time steps and then add nodes in regions of interest, wherein the new nodes are at times which are intermediate to the original time steps.) In another instance, regions in which additional information is needed may be identified so that additional nodes can be inserted into the mesh and corresponding new elements defined.

Figure 7:
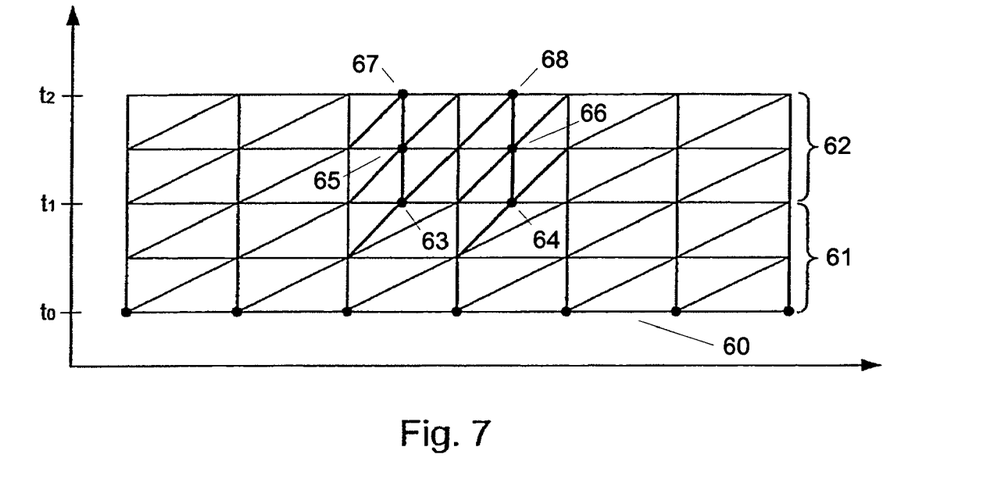
FIG. 7 is a diagram illustrating the propagation of refinements to subsequent time slabs.
Figure 8:
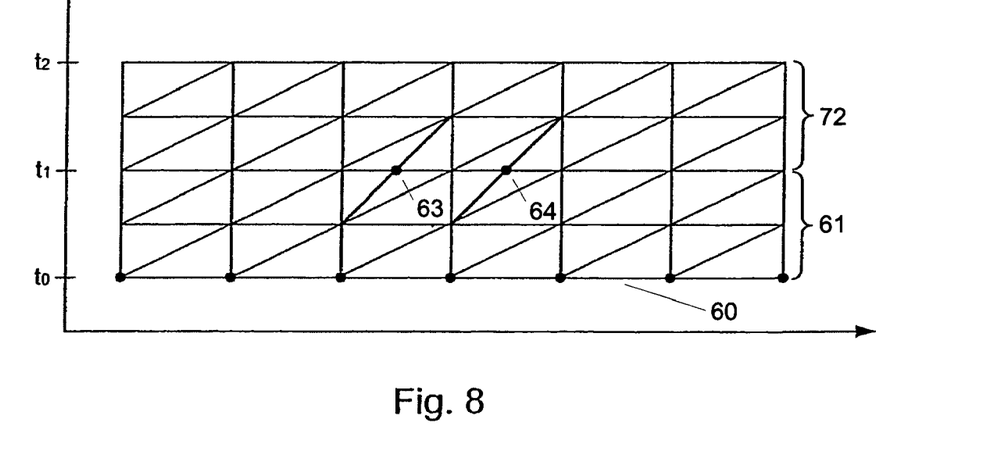
FIG. 8 is a diagram illustrating the manner in which generating time slabs which follow a current time slab may limit propagation of refinements to the subsequent time slabs.

As indicated above, this embodiment involves the generation of not only the time slab which will next be solved (the "current" time slab,) but also a succeeding time slab. By generating the succeeding time slab prior to refining the current time slab, refinements which are made to the current time slab will not propagate through the subsequent time slabs. This is illustrated in FIGS. 7 and 8. FIG. 7 is a diagram illustrating the propagation of refinements to subsequent time slabs. In this figure, a one-dimensional mesh 60 is extruded over the interval t0 to t1 to form a first time slab 61. (It can be seen that the time slab in this instance comprises two layers.) Current time slab 61 is then refined. In this case, the refinement consists of the addition of two new nodes 63 and 64. After current time slab 61 is solved, a succeeding time slab 62 is generated by extruding the refined one-dimensional mesh at time t1. Succeeding time slab 62 therefore includes nodes 65–68, whether they are necessary or not, simply because they were extruded from nodes 63 and 64.

In the preferred embodiment, the second time slab is extruded over the interval t1 to t2 before refinements to the current time slab are made. This situation is illustrated in FIG. 8. The current time slab 61 is again generated by extruding one-dimensional mesh 60 over the interval t0 to t1. The succeeding time slab 72 is extruded from the same one-dimensional mesh prior to making any refinements. After succeeding time slab 72 is generated, current time slab 61 is refined. Nodes 63 and 64 are again added to the current time slab. Because they form part of the boundary between current time slab 61 and succeeding time slab 72, these nodes are also part of the succeeding time slab. With a succeeding slab must therefore be refined to incorporate these nodes. While they are integrated into succeeding time slab 72, however, the additional nodes do not propagate through to the other side of the succeeding time slab. Consequently, they will not be included in the extrusion of the one-dimensional mesh to form a time slab from t2 to t3. They may nevertheless be added to succeeding time slab 72, if necessary, when that time slab is refined.

The benefits and advantages which may be provided by the present invention have been described above with regard to specific embodiments. These benefits and advantages, and any elements or limitations that may cause them to occur or to become more pronounced are not to be construed as a critical, required, or essential features of any or all of the claims. As used herein, the terms "comprises," "comprising," or any other variations thereof, are intended to be interpreted as non-exclusively including the elements or limitations which follow those terms. Accordingly, a process, method, article, or apparatus that comprises a list of elements does not include only those elements but may include other elements not expressly listed or inherent to the claimed process, method, article, or apparatus.

While the present invention has been described with reference to particular embodiments, it should be understood that the embodiments are illustrative and that the scope of the invention is not limited to these embodiments. Many variations, modifications, additions and improvements to the embodiments described above are possible. Particularly, these variations may include computers or other data processing devices, computer readable media (such as floppy disks, CD-ROMs, DVD-ROMs, etc.,) storage devices, computer memories and the like which contain software, firmware or other programming embodying the foregoing methods. It is contemplated that these variations, modifications, additions and improvements fall within the scope of the invention as detailed within the following claims.

What is claimed is:

1. A computer readable medium containing a plurality of computer executable instructions for performing a computer implemented method for determining a dynamic fluid flow representation of an n-dimensional spatial system of a physical geological reservoir, wherein n is not greater than three, the method comprising:
   generating a time slab, wherein the time slab comprises an n+1-dimensional finite element mesh based on the n-dimensional spatial system, the n+1-dimensional finite element mesh including nodes in a first time plane and nodes in a second time plane;
   refining the n+1-dimensional finite element mesh to include a node between the first and second time planes, the node associated with a sub region of the n-dimensional spatial system; and
   generating the dynamic fluid flow representation of the physical geological reservoir based on the time slab.

2. The computer readable medium of claim 1 wherein the method further comprises extruding succeeding time slabs, wherein each succeeding time slab is extruded from a preceding time slab; and generating dynamic fluid flow representations for each succeeding time slab.

3. The computer readable medium of claim 2 wherein each succeeding time slab is extruded from the preceding time slab after the dynamic fluid flow representation has been generated for the preceding time slab.

4. The computer readable medium of claim 2 wherein each succeeding time slab is extruded from the preceding time slab before a dynamic fluid flow representation has been generated for the preceding time slab.

5. The computer readable medium of claim 2 wherein the method further comprises refining each time slab prior to generating the dynamic fluid flow representation for the time slab to create a refined time slab.

6. The computer readable medium of claim 5 wherein refining each time slab comprises incorporating into the refined time slab nodes which were added to a preceding time slab in a refinement of the preceding time slab.

7. The computer readable medium of claim 5 wherein refining each time slab comprises incorporating one or more new nodes into the refined time slab and defining one or more corresponding new elements in the refined time slab.

8. The computer readable medium of claim 5 wherein refining each time slab comprises removing one or more nodes from the refined time slab and collapsing one or more corresponding elements in the refined time slab.

9. The computer readable medium of claim 5 wherein refining each time slab comprises defining a plurality of distinct nodes at times between nodes in each time slab.

10. The computer readable medium of claim 2 wherein the method further comprises archiving the dynamic fluid flow representation for each time slab after the dynamic fluid flow representation is generated.

11. The computer readable medium of claim 10 wherein the method further comprises maintaining a current one dynamic fluid flow representation of the time slabs in memory while a dynamic fluid flow representation is generated for the succeeding one of the time slabs.

12. The computer readable medium of claim 2 wherein the method further comprises maintaining dynamic fluid flow representation for each previous one of the time slabs in memory while dynamic fluid flow representations are generated for each subsequent one of the time slabs.

13. The computer readable medium of claim 2 wherein generating dynamic fluid flow representations for each of the time slabs comprises, for at least one of the time slabs, computing a non-converging dynamic fluid flow representation for the at least one time slab, refining the at least one time slab, and computing a new dynamic fluid flow representation for the at least one time slab.

14. The computer readable medium of claim 2 wherein generating dynamic fluid flow representations for each of the time slabs comprises, for at least one of the time slabs, computing a first dynamic fluid flow representation for the at least one time slab, determining that the first dynamic fluid flow representation is not within an error tolerance, refining the at least one time slab, and computing a new dynamic fluid flow representation for the at least one time slab.

15. The computer readable medium of claim 2 wherein generating succeeding time slabs comprises generating each time slab as an n+1-dimensional unstructured finite element mesh.

16. A computer readable medium containing a plurality of computer executable instructions for performing a method for generating a finite element representation of a geological reservoir, the method comprising:
generating a time slab, wherein the time slab comprises an n+1-dimensional finite element mesh based on an n-dimensional finite element spatial mesh representation of the geological reservoir and wherein the n+1-dimensional finite element mesh corresponds to a time interval within a selected time range, wherein n is not greater than three;
generating a first representation for the time slab;
determining whether the first representation meets an error standard;
adding nodes to the n+1-dimensional finite element mesh in response to the determining, the nodes associated with a time within the time interval and a portion of the n-dimensional finite element spatial mesh representation; and generating a second representation for the time slab.

17. The computer readable medium of claim 16 wherein the n+1-dimensional finite element mesh comprises an n+1-dimensional unstructured finite element mesh.

18. The computer readable medium of claim 16 further comprising maintaining only the second representation in memory while the second representation is generated and archiving the time slab after the second representation is generated.

19. A computer implemented method for representing fluid flow in a physical geological reservoir, the method comprising:
providing a spatial mesh representation of the physical geological reservoir;
generating a first time slab based on the spatial mesh representation, the first time slab including a first set of nodes temporally separated by a first time step in a first region of the spatial mesh representation and including a second set of nodes temporally separated by a second time step in a second region of the spatial mesh representation, wherein generating the first time slab comprises extruding the spatial mesh representation from a first time to a second time and generating elements based on the extruded spatial mesh representation, wherein generating the first time slab further comprises adding a third set of nodes between the first and second times associated with the second region and adjusting the elements based on the third set of nodes, the second set of nodes including the third set of nodes, wherein the second time step is less than the first time step; and
generating a representation of fluid flow in the physical geological reservoir based on the first time slab.

20. The computer implemented method of claim 19, wherein generating the first time slab comprises generating an erred representation that is outside an error tolerance, the third set of nodes added in response to the erred representation.

21. The computer implemented method of claim 19, further comprising generating a second time slab and generating a second representation of fluid flow in the geological reservoir based on the second time slab.

22. The computer implemented method of claim 21, wherein the representation of fluid flow in the geological reservoir based on the first time slab is archived prior to generating the second representation.

23. The computer implemented method of claim 22, wherein archiving the representation of fluid flow includes removing the representation from core memory.

24. The computer implemented method of claim 21, wherein the representation of fluid flow in the geological reservoir is maintained in memory while the second representation is generated.

* * * * *

UNITED STATES PATENT AND TRADEMARK OFFICE
CERTIFICATE OF CORRECTION

PATENT NO. : 7,006,951 B2
APPLICATION NO. : 09/895820
DATED : February 28, 2006
INVENTOR(S) : Stuart W. Pond, Jr. et al.

Page 1 of 1

Figure 6D:
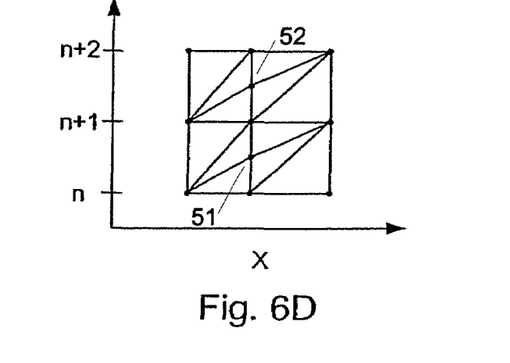
Figure 6E:
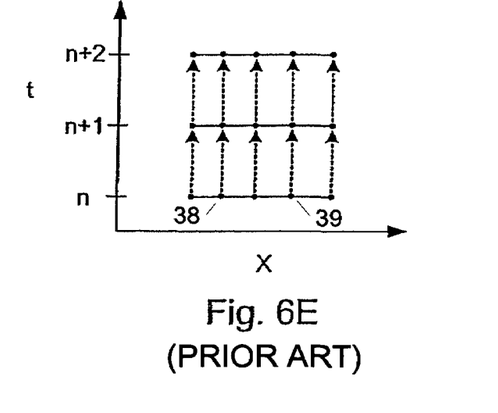
Figure 6F:
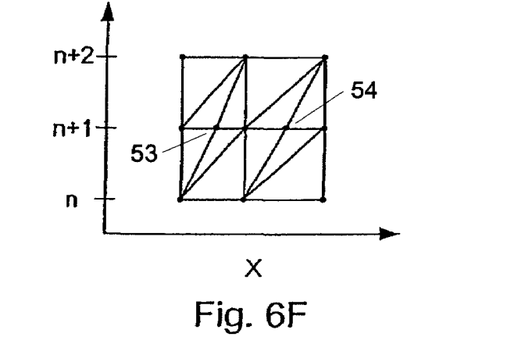

It is certified that error appears in the above-identified patent and that said Letters Patent is hereby corrected as shown below:

column 6, line 49, please delete "FIG. 60" and insert --FIG. 6C--.

column 6, line 60, please delete "FIG. 6" and insert --FIG. 6D--.

column 6, lines 65-67, please delete "space) is generated. This three-dimensional mesh may be generated by any suitable means. This three-dimensional".

Signed and Sealed this

Eighth Day of August, 2006

JON W. DUDAS
*Director of the United States Patent and Trademark Office*